United States Patent
Varadarajan

(10) Patent No.: US 10,211,310 B2
(45) Date of Patent: Feb. 19, 2019

(54) REMOTE PLASMA BASED DEPOSITION OF SIOC CLASS OF FILMS

(75) Inventor: Bhadri Varadarajan, Beaverton, OR (US)

(73) Assignee: NOVELLUS SYSTEMS, INC., Fremont, CA (US)

( * ) Notice: Subject to any disclaimer, the term of this patent is extended or adjusted under 35 U.S.C. 154(b) by 452 days.

(21) Appl. No.: 13/494,836

(22) Filed: Jun. 12, 2012

(65) Prior Publication Data

US 2013/0330935 A1 Dec. 12, 2013

(51) Int. Cl.

| | |
|---|---|
| C23C 16/32 | (2006.01) |
| C23C 16/50 | (2006.01) |
| H01L 21/02 | (2006.01) |
| H01L 29/49 | (2006.01) |
| C23C 16/452 | (2006.01) |
| H01L 21/768 | (2006.01) |

(52) U.S. Cl.
CPC ........ *H01L 29/4991* (2013.01); *C23C 16/325* (2013.01); *C23C 16/452* (2013.01); *C23C 16/50* (2013.01); *H01L 21/02126* (2013.01); *H01L 21/02211* (2013.01); *H01L 21/02216* (2013.01); *H01L 21/02274* (2013.01); *H01L 21/76831* (2013.01); *H01L 21/76834* (2013.01); *H01L 29/4983* (2013.01); *H01L 2221/1047* (2013.01)

(58) Field of Classification Search
CPC ............. H01L 29/4991; H01L 29/4983; H01L 21/02126; H01L 21/02211; H01L 21/02216; H01L 21/02274; H01L 21/76831; H01L 21/76834; C23C 16/452; C23C 16/50

See application file for complete search history.

(56) References Cited

U.S. PATENT DOCUMENTS

| | | | |
|---|---|---|---|
| 4,177,474 A | 12/1979 | Ovshinsky | |
| 4,656,110 A | 4/1987 | Yamazaki | |

(Continued)

FOREIGN PATENT DOCUMENTS

| | | |
|---|---|---|
| CN | 101111930 A | 1/2008 |
| CN | 101536191 A | 9/2009 |

(Continued)

OTHER PUBLICATIONS

"Silicon Containing Polymers: The Science and Technology of Their Synthesis and Applications" R.G Jones, W. Ando, J. Chojnowski, Springer, Nov. 30, 2001 p. 705.*

(Continued)

*Primary Examiner* — Charles D Garber

(74) *Attorney, Agent, or Firm* — Weaver Austin Villeneuve & Sampson LLP

(57) ABSTRACT

Provided are methods and systems for providing oxygen doped silicon carbide. A layer of oxygen doped silicon carbide can be provided under process conditions that employ silicon-containing precursors that have one or more silicon-hydrogen bonds and/or silicon-silicon bonds. The silicon-containing precursors also have one or more silicon-oxygen bonds and/or silicon-carbon bonds. One or more radical species in a substantially low energy state can react with the silicon-containing precursors to form the oxygen doped silicon carbide. The one or more radical species can be formed in a remote plasma source.

14 Claims, 4 Drawing Sheets

(56) References Cited

U.S. PATENT DOCUMENTS

| | | |
|---|---|---|
| 4,952,658 A | 8/1990 | Kalchauer et al. |
| 5,034,355 A | 7/1991 | Tani et al. |
| 5,108,965 A | 4/1992 | Baldi |
| 5,324,690 A | 6/1994 | Gelatos et al. |
| 5,447,816 A | 9/1995 | Kodama et al. |
| 5,464,699 A | 11/1995 | Baldi |
| 5,654,208 A | 8/1997 | Harris et al. |
| 5,739,579 A | 4/1998 | Chiang et al. |
| 5,807,615 A | 9/1998 | Sindzingre et al. |
| 5,958,324 A | 9/1999 | Bujalski et al. |
| 6,045,877 A | 4/2000 | Gleason et al. |
| 6,100,587 A | 8/2000 | Merchant et al. |
| 6,150,719 A | 11/2000 | Saia et al. |
| 6,159,871 A | 12/2000 | Loboda et al. |
| 6,197,688 B1 | 3/2001 | Simpson |
| 6,242,686 B1 | 6/2001 | Kishimoto et al. |
| 6,262,445 B1 | 7/2001 | Swanson et al. |
| 6,316,167 B1 | 11/2001 | Angelopoulos |
| 6,352,945 B1 | 3/2002 | Matsuki |
| 6,383,898 B1 | 5/2002 | Kishimoto |
| 6,383,955 B1 | 5/2002 | Matsuki |
| 6,395,150 B1 | 5/2002 | Van Cleemput et al. |
| 6,399,484 B1 | 6/2002 | Yamazaki et al. |
| 6,410,419 B1 | 6/2002 | Merchant et al. |
| 6,417,092 B1 | 7/2002 | Jain et al. |
| 6,424,044 B1 | 7/2002 | Han et al. |
| 6,432,846 B1 | 8/2002 | Matsuki |
| 6,448,186 B1 | 9/2002 | Olson et al. |
| 6,455,409 B1 | 9/2002 | Subramanian et al. |
| 6,465,366 B1 | 10/2002 | Nemani et al. |
| 6,465,372 B1 | 10/2002 | Xia et al. |
| 6,506,692 B2 | 1/2003 | Andideh |
| 6,624,064 B1 | 9/2003 | Sahin et al. |
| 6,670,715 B2 | 12/2003 | Yang et al. |
| 6,764,958 B1 | 7/2004 | Nemani et al. |
| 6,767,836 B2 | 7/2004 | San et al. |
| 6,774,489 B2 | 8/2004 | Russell et al. |
| 6,790,767 B2 | 9/2004 | Lee |
| 6,790,788 B2 | 9/2004 | Li et al. |
| 6,846,391 B1 | 1/2005 | Papasouliotis et al. |
| 6,875,687 B1 | 4/2005 | Weidman et al. |
| 6,881,683 B2 | 4/2005 | Matsuki et al. |
| 6,890,850 B2 | 5/2005 | Lee et al. |
| 6,919,270 B2 | 7/2005 | Satoh et al. |
| 6,930,013 B2 | 8/2005 | Choi et al. |
| 6,935,553 B2 | 8/2005 | Suga et al. |
| 6,949,450 B2 | 9/2005 | Chiang et al. |
| 6,967,405 B1 | 11/2005 | Yu et al. |
| 6,855,645 B2 | 12/2005 | Tang et al. |
| 6,991,959 B2 | 1/2006 | Goundar et al. |
| 7,064,088 B2 | 6/2006 | Hyodo et al. |
| 7,091,137 B2 | 8/2006 | Lee et al. |
| 7,115,534 B2 | 10/2006 | Nguyen et al. |
| 7,163,889 B2 | 1/2007 | Yu et al. |
| 7,163,896 B1 | 1/2007 | Zhu et al. |
| 7,200,460 B2 | 4/2007 | Campana et al. |
| 7,239,017 B1 | 7/2007 | Yu et al. |
| 7,253,125 B1 | 8/2007 | Bandyopadhyay et al. |
| 7,256,139 B2 | 8/2007 | Moghadam et al. |
| 7,282,438 B1 | 10/2007 | Yu et al. |
| 7,381,662 B1 | 6/2008 | Niu et al. |
| 7,420,275 B1 | 9/2008 | Yu et al. |
| 7,468,290 B2 | 12/2008 | Lukas et al. |
| 7,573,061 B1 | 8/2009 | Yu et al. |
| 7,622,400 B1 | 11/2009 | Fox et al. |
| 7,662,355 B2 | 2/2010 | Kamisako et al. |
| 7,709,063 B2 | 5/2010 | Yuda et al. |
| 7,736,728 B2 | 6/2010 | Loboda et al. |
| 7,842,604 B1 | 11/2010 | Yu et al. |
| 7,915,166 B1 | 3/2011 | Yu et al. |
| 7,923,385 B2 | 4/2011 | Wu et al. |
| 7,968,436 B1 | 6/2011 | Yu et al. |
| 8,021,992 B2 | 9/2011 | Liou et al. |
| 8,053,372 B1 | 11/2011 | Greer et al. |
| 8,124,522 B1 | 2/2012 | Wu et al. |
| 8,168,268 B2 | 5/2012 | Ovshinsky |
| 8,173,537 B1 | 5/2012 | Chattopadhyay et al. |
| 8,178,168 B2 | 5/2012 | O'Neill et al. |
| 8,178,443 B2 | 5/2012 | Rangarajan et al. |
| 8,247,332 B2 | 8/2012 | Rangarajan et al. |
| 8,669,181 B1 | 3/2014 | Yu et al. |
| 8,846,525 B2 | 9/2014 | Rangarajan et al. |
| 9,234,276 B2 | 1/2016 | Varadarajan |
| 9,337,068 B2 | 5/2016 | Antonelli et al. |
| 9,371,579 B2 | 6/2016 | Varadarajan et al. |
| 2001/0021491 A1 | 9/2001 | Chen et al. |
| 2002/0016085 A1 | 2/2002 | Huang et al. |
| 2002/0019148 A1 | 2/2002 | Hawryluk et al. |
| 2002/0024117 A1 | 2/2002 | Russell et al. |
| 2002/0039625 A1 | 4/2002 | Powell et al. |
| 2002/0106891 A1* | 8/2002 | Kim et al. .................. 438/624 |
| 2002/0132101 A1 | 9/2002 | Fonash et al. |
| 2003/0001275 A1 | 1/2003 | Sambucetti et al. |
| 2003/0036215 A1 | 2/2003 | Reid |
| 2003/0049460 A1 | 3/2003 | O'Neill et al. |
| 2003/0057553 A1 | 3/2003 | DelaRosa et al. |
| 2003/0064154 A1* | 4/2003 | Laxman ............... C07F 7/0859 427/255.28 |
| 2003/0068881 A1 | 4/2003 | Xia et al. |
| 2003/0082296 A1 | 5/2003 | Elers et al. |
| 2003/0089992 A1 | 5/2003 | Rathi et al. |
| 2003/0154141 A1 | 8/2003 | Capazario et al. |
| 2003/0162033 A1 | 8/2003 | Johnson et al. |
| 2003/0194496 A1 | 10/2003 | Xu et al. |
| 2003/0232150 A1 | 12/2003 | Arnold et al. |
| 2003/0232514 A1 | 12/2003 | Kim et al. |
| 2004/0067308 A1 | 4/2004 | Zheng et al. |
| 2004/0084680 A1 | 5/2004 | Ruelke et al. |
| 2004/0084774 A1 | 5/2004 | Li et al. |
| 2004/0089924 A1 | 5/2004 | Yuasa et al. |
| 2004/0113279 A1 | 6/2004 | Chen et al. |
| 2004/0115876 A1 | 6/2004 | Goundar et al. |
| 2004/0124531 A1 | 7/2004 | Venkatraman et al. |
| 2004/0161535 A1 | 8/2004 | Goundar et al. |
| 2004/0178169 A1 | 9/2004 | Desphande |
| 2004/0194706 A1 | 10/2004 | Wang et al. |
| 2004/0207084 A1 | 10/2004 | Hedrick et al. |
| 2005/0014361 A1 | 1/2005 | Nguyen et al. |
| 2005/0042889 A1 | 2/2005 | Lee et al. |
| 2005/0100682 A1 | 5/2005 | Fukiage et al. |
| 2005/0202685 A1 | 9/2005 | Huang et al. |
| 2005/0233555 A1 | 10/2005 | Rajagopalan et al. |
| 2005/0236711 A1 | 10/2005 | Wang et al. |
| 2005/0245071 A1 | 11/2005 | Wu et al. |
| 2005/0255714 A1 | 11/2005 | Iyer et al. |
| 2005/0277302 A1 | 12/2005 | Nguyen et al. |
| 2005/0287811 A1 | 12/2005 | Inukai |
| 2006/0019486 A1 | 1/2006 | Yu et al. |
| 2006/0040507 A1 | 2/2006 | Mak et al. |
| 2006/0110931 A1 | 5/2006 | Fukazawa et al. |
| 2007/0004204 A1 | 1/2007 | Fukazawa et al. |
| 2007/0141812 A1 | 6/2007 | Zagwijn et al. |
| 2007/0166546 A1 | 7/2007 | Ichikawa et al. |
| 2007/0232071 A1 | 10/2007 | Balseanu et al. |
| 2007/0264839 A1 | 11/2007 | Van Gompel et al. |
| 2007/0281497 A1 | 12/2007 | Liu et al. |
| 2008/0050933 A1 | 2/2008 | Ozaki et al. |
| 2008/0063809 A1 | 3/2008 | Lee et al. |
| 2008/0064173 A1* | 3/2008 | Hung .......................... 438/299 |
| 2008/0070396 A1 | 3/2008 | Budrevich et al. |
| 2008/0099754 A1 | 5/2008 | Enicks |
| 2008/0122103 A1 | 5/2008 | Bonilla et al. |
| 2008/0128907 A1 | 6/2008 | Yang et al. |
| 2008/0173984 A1 | 7/2008 | Lin et al. |
| 2008/0217746 A1 | 9/2008 | Morita et al. |
| 2008/0254641 A1 | 10/2008 | Kobayashi et al. |
| 2009/0042402 A1 | 2/2009 | Morioka |
| 2009/0082240 A1* | 3/2009 | Nukui et al. ................ 510/176 |
| 2009/0215282 A1 | 8/2009 | Moore et al. |
| 2009/0218699 A1* | 9/2009 | Torres et al. ................ 257/774 |
| 2009/0258487 A1 | 10/2009 | Lin et al. |
| 2009/0264277 A1 | 10/2009 | Raj et al. |
| 2009/0294925 A1 | 12/2009 | Lin et al. |
| 2010/0081293 A1* | 4/2010 | Mallick et al. ............. 438/794 |

(56) References Cited

U.S. PATENT DOCUMENTS

| | | | |
|---|---|---|---|
| 2010/0207274 A1* | 8/2010 | Hayashi et al. | 257/751 |
| 2010/0308463 A1 | 12/2010 | Yu | |
| 2011/0027957 A1* | 2/2011 | Berry | 438/301 |
| 2011/0045676 A1* | 2/2011 | Park et al. | 438/771 |
| 2011/0111590 A1 | 5/2011 | Edelstein et al. | |
| 2011/0114994 A1 | 5/2011 | Mandlik et al. | |
| 2011/0135557 A1 | 6/2011 | Rangarajan et al. | |
| 2011/0236594 A1 | 9/2011 | Haverkamp et al. | |
| 2012/0009802 A1 | 1/2012 | LaVoie et al. | |
| 2012/0077349 A1 | 3/2012 | Li et al. | |
| 2012/0142172 A1 | 6/2012 | Fox et al. | |
| 2013/0075455 A1 | 3/2013 | Shimizu | |
| 2013/0084711 A1 | 4/2013 | Liang et al. | |
| 2013/0119406 A1 | 5/2013 | Notsu et al. | |
| 2013/0129940 A1* | 5/2013 | Xiao | C07F 7/025 427/578 |
| 2013/0157466 A1 | 6/2013 | Fox | |
| 2013/0242493 A1* | 9/2013 | Shenoy et al. | 361/679.21 |
| 2013/0330932 A1 | 12/2013 | Rangarajan et al. | |
| 2013/0330935 A1 | 12/2013 | Varadarajan | |
| 2014/0175617 A1 | 6/2014 | Antonelli et al. | |
| 2014/0356549 A1 | 12/2014 | Varadarajan | |
| 2015/0118394 A1 | 4/2015 | Varadarajan et al. | |
| 2015/0303056 A1 | 10/2015 | Varadarajan et al. | |
| 2016/0090649 A1 | 3/2016 | Varadarajan | |
| 2016/0276140 A1 | 9/2016 | Varadarajan et al. | |
| 2016/0314964 A1 | 10/2016 | Tang et al. | |

FOREIGN PATENT DOCUMENTS

| | | |
|---|---|---|
| EP | 1 172 845 A2 | 1/2002 |
| EP | 1 186 685 A2 | 3/2002 |
| JP | 2001-160547 | 6/2001 |
| JP | 2002-176100 | 6/2002 |
| JP | 2002-217189 | 8/2002 |
| JP | 2004-247725 | 9/2004 |
| JP | 2007-158000 | 6/2007 |
| JP | 2008-529296 | 7/2008 |
| TW | 476807 B | 2/2002 |
| TW | 535253 B | 6/2003 |
| TW | 200405437 | 4/2004 |
| TW | 200803988 | 1/2008 |
| TW | 200839884 | 10/2008 |
| TW | 200903635 A | 1/2009 |
| TW | 200908138 | 2/2009 |
| TW | 201214563 A | 4/2012 |
| WO | WO 2007/116492 | 10/2007 |

OTHER PUBLICATIONS

Yu et al., U.S. Appl. No. 13/032,392, filed Feb. 22, 2011.
Wu et al., U.S. Appl. No. 11/693,661, filed Mar. 29, 2007.
Rangarajan et al., U.S. Appl. No. 13/967,832, filed Aug. 15, 2013.
Varadarajan, Bhadri, U.S. Appl. No. 13/907,699, filed May 31, 2013.
U.S. Office Action dated Feb. 24, 2005 issued in U.S. Appl. No. 10/670,660.
U.S. Notice of Allowance dated Sep. 11, 2006 issued in U.S. Appl. No. 11/234,808.
U.S. Office Action dated May 3, 2006 issued in U.S. Appl. No. 10/915,117.
U.S. Final Office Action dated Sep. 7, 2006 issued in U.S. Appl. No. 10/915,117.
U.S. Office Action dated Dec. 11, 2006 issued in U.S. Appl. No. 10/915,117.
U.S. Notice of Allowance dated Feb. 26, 2007 issued in U.S. Appl. No. 10/915,117.
U.S. Office Action dated May 1, 2008 issued in U.S. Appl. No. 11/373,847.
U.S. Notice of Allowance and Allowed Claims dated Jul. 1, 2008 issued in U.S. Appl. No. 11/373,847.

U.S. Office Action dated Apr. 10, 2009 issued in U.S. Appl. No. 11/805,356.
U.S. Final Office Action dated Oct. 13, 2009 issued in U.S. Appl. No. 11/805,356.
U.S. Office Action dated Apr. 8, 2010 issued in U.S. Appl. No. 11/805,356.
U.S. Notice of Allowance and Allowed Claims dated Jul. 26, 2010 issued in U.S. Appl. No. 11/805,356.
U.S. Office Action dated Sep. 6, 2006 issued in U.S. Appl. No. 10/869,474.
U.S. Office Action dated Feb. 9, 2007 issued in U.S. Appl. No. 10/869,474.
U.S. Final Office Action dated Jun. 28, 2007 issued in U.S. Appl. No. 10/869,474.
U.S. Notice of Allowance dated Jul. 26, 200 issued in U.S. Appl. No. 10/869,474.
U.S. Office Action dated Mar. 17, 2008 issued in U.S. Appl. No. 11/893,490.
U.S. Office Action dated Aug. 8, 2008 issued in U.S. Appl. No. 11/893,490.
U.S. Office Action (Ex Parte Quayle) dated Jan. 27, 2009 issued in U.S. Appl. No. 11/893,490.
U.S. Notice of Allowance dated May 4, 2009 issued in U.S. Appl. No. 11/893,490.
U.S. Office Action dated Oct. 15, 2010 issued in U.S. Appl. No. 12/497,322.
U.S. Notice of Allowance and Allowed Claims dated Mar. 11, 2011 issued in U.S. Appl. No. 12/497,322.
U.S. Office Action dated Nov. 20, 2009 issued in U.S. Appl. No. 11/710,652.
U.S. Final Office Action dated Apr. 15, 2010 issued in U.S. Appl. No. 11/710,652.
U.S. Office Action dated Aug. 5, 2010 issued in U.S. Appl. No. 11/710,652.
U.S. Notice of Allowance and Allowed Claims dated Nov. 24, 2010 issued in U.S. Appl. No. 11/710,652.
U.S. Office Action dated Jul. 9, 2013 issued in U.S. Appl. No. 11/710,652.
U.S. Notice of Allowance dated Oct. 25, 2013 issued in U.S. Appl. No. 11/710,652.
U.S. Office Action dated Aug. 28, 2009 issued in U.S. Appl. No. 11/693,661.
U.S. Office Action dated Feb. 24, 2010 issued in U.S. Appl. No. 11/693,661.
U.S. Final Office Action dated Nov. 5, 2010 issued in U.S. Appl. No. 11/693,661.
U.S. Office Action dated Dec. 31, 2008 issued in U.S. Appl. No. 11/693,617.
U.S. Office Action dated Oct. 7, 2009 issued in U.S. Appl. No. 11/693,617.
U.S. Office Action dated Jun. 10, 2010 issued in U.S. Appl. No. 11/693,617.
U.S. Final Office Action dated Jan. 20, 2011 issued in U.S. Appl. No. 11/693,617.
U.S. Office Action dated Sep. 16, 2011 issued in U.S. Appl. No. 11/693,617.
U.S. Notice of Allowance dated Jan. 9, 2012 issued in U.S. Appl. No. 11/693,617.
U.S. Office Action dated Jan. 12, 2011 issued in U.S. Appl. No. 12/082,496.
U.S. Final Office Action dated Aug. 4, 2011 issued in U.S. Appl. No. 12/082,496.
U.S. Notice of Allowance dated Oct. 26, 2011 issued in U.S. Appl. No. 12/082,496.
U.S. Notice of Allowance dated Apr. 10, 2012 issued in U.S. Appl. No. 12/631,691.
Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.

(56) References Cited

OTHER PUBLICATIONS

Maeda et al. (Sep. 1989), "A Low-Permittivity Interconnection Using an SiBN Interlayer," *IEEE Transactions on Electron Devices* 36(9).
Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.
Wrobel et al., "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 2010, vol. 24, pp. 201-207.
Wu et al. (Oct. 17-19, 2006), "Ultra Low k Dielectrics Prepared by PECVD Using a Single-Precursor and Treated by UV Assisted Thermal Processing," *Advanced Metallization Conference (AMC)* 2006, pp. 1-6, San Diego, CA.
Antonelli et al., U.S. Appl. No. 14/105,026, filed Dec. 12, 2013.
U.S. Office Action dated Feb. 7, 2014 issue in U.S. Appl. No. 13/967,832.
Chinese First Office Action dated Jan. 24, 2014 issued in Application No. 201010569747.0.
U.S. Notice of Allowance dated May 30, 2014 issued in U.S. Appl. No. 13/967,832.
U.S. Notice of Allowance dated Sep. 5, 2014 issued in U.S. Appl. No. 13/967,832.
Chinese Second Office Action dated Aug. 14, 2014 issued in CN Application No. 201010569747.0.
Japanese Office Action dated Jul. 29, 2014 issued in JP Application No. 2010-256165.
Varadarajan et al., U.S. Appl. No. 14/616,435, filed Feb. 6, 2015.
Tan et al., U.S. Appl. No. 14/692,627, filed Apr. 21, 2015 entitled "Gap Fill Using Carbon-Based Films."
U.S. Office Action dated Dec. 19, 2014 issued in U.S. Appl. No. 13/907,699.
U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Sep. 15, 2015 issued in U.S. Appl. No. 14/062,648.
U.S. Office Action dated Sep. 29, 2015 issued in U.S. Appl. No. 14/105,026.
Chinese Third Office Action dated Jan. 13, 2015 issued in CN Application No. 201010569747.0.
Taiwan Notice of Allowance and Search Report [with translation] dated Jul. 8, 2015 issued in Application No. TW 099140866.
Blaszczyk-Lezak et al., (2005) "Silicon Carbonitride Films Produced by Remote Hydrogen Microwave Plasma CVD Using a (Dimethylamino)dimethylsilane Precursor," Chemical Vapor Deposition, 11(1):44-52.
"Fozza et al., (Jul. 2000) ""Vacuum ultraviolet to visible emission from hydrogen plasma: Effect of excitation frequency,"" Journal of Applied Physics, 88(1):20-33".
Hatanaka et al., (2000) "Experiments and analyses of SiC thin film deposition from organo-silicon by a remote plasma method," *Thin Solid Films*, 368:287-291.

Holländer et al., (May 1994) "Vacuum ultraviolet emission from microwave plasmas of hydrogen and its mixtures with helium and oxygen," *J. Vac. Sci. Technol. A*, 12(3):879-882.
Huran, J., et al., (2004) "RBS study of amorphous silicon carbide films deposited by PECVD," *Czechoslovak Journal of Physics*, 54(Suppl. C):C1006-C1010.
Xu,Ying-Yu, et al., (1999) "Preparation of SiC Thin Film Using Organosilicon by Remote Plasma CVD Method," Mat. Res. Soc. Symp. Proc., 544:185-189.
Wrobel et al., *Oligomerization and Polymerization Steps in Remote Plasma Chemical Vapor Deposition of Silicon-Carbon and Silica Films from Organosilicon Sources*, Mar. 20, 2000, pp. 1884-1895.
Grubbs, et al.., *Attenuation of hydrogen radicals traveling under flowing gas conditions through tubes of difference materials*, May/Jun. 2006, *J. Vac. Sci Technol. A* 24(3), pp. 486-496.
Benilan, et al., *Optimization of microwave Hydrogen plasma discharges to mimic Lyman a (121.6 nm) solar irradiations*, EPSC Abstracts, vol. 6, 2011, 2 pages.
Fozza et al., *Vacuum ultraviolet to visible emission of some pure gases and their mixtures used for plasma processing*, Jan./Feb. 1998, *J. Vac. Sci. Technol. A*, 16(1), pp. 72-77.
Wrobel et al., *Reactivity of organosilicon precursors in remote hydrogen microwave plasma chemical vapor deposition of silicon carbide and silicon carbonitride thin-film coatings*, published Dec. 17, 2009, Applied Organometalic Chemistry, pp. 201-207.
Radical (chemistry), Wikipedia, https://en.wikipedia.org/wiki/Radical_(chemistry).
MHF, Molecular Hydrogen Foundation, Dummies' Guide to Hydrogen, www.molecularhydrogenfoundation.org/core-information/dummies-guide-to-hydrogen-gas/.
Development of Current Atomic Theory http://chemed.chem.purdue.edu/genchem/topicreview/bp/ch6/bohr.html.
U.S. Notice of Allowance dated Jan. 29, 2016 issued in U.S. Appl. No. 14/105,026.
Taiwan Office Action [no translation] dated Jan. 14, 2016 issued in Application No. TW 104126278.
Varadarajan, Bhadri, U.S. Appl. No. 14/961,637, filed Dec. 7, 2015 entitled "Method to Obtain SIC Class of Films of Desired Composition and Film Properties."
U.S. Office Action, dated Nov. 2, 2015 issued in U.S. Appl. No. 14/616,435.
Taiwan Office Action, dated Dec. 22, 2015 issued in Application No. TW 102120742.
Varadarajan et al., U.S. Appl. No. 15/169,530, filed May 31, 2016.
U.S. Notice of Allowance dated Feb. 19, 2016 issued in U.S. Appl. No. 14/062,648.
U.S. Final Office Action dated Mar. 10, 2016 issued in U.S. Appl. No. 14/616,435.
Varadarajan et al., U.S. Appl. No. 15/283,159, filed Sep. 30, 2016 entitled "Remote Plasma Based Deposition of Graded or Multilayered Silicon Carbide Film."
U.S. Office Action dated Jul. 8, 2016 issued in U.S. Appl. No. 14/616,435.
U.S. Office Action dated Sep. 12, 2016 issued in U.S. Appl. No. 14/692,627.
Chinese First Office Action dated Sep. 5, 2016 issued in Application No. CN 201410576747.1.

\* cited by examiner

REMOTE PLASMA BASED DEPOSITION OF SIOC CLASS OF FILMS

FIELD

The present disclosure relates generally to the formation of oxygen doped silicon carbides.

BACKGROUND

The silicon carbide (SiC) class of thin films has unique physical, chemical, and mechanical properties and is used in a variety of applications, particularly integrated circuit applications. One such SiC class of thin films include oxygen doped SiC, also known as silicon oxycarbide (SiOC).

SUMMARY OF THE INVENTION

Provided are methods and systems for preparing oxygen doped silicon carbide. A layer of oxygen doped silicon carbide can be provided using a process employing silicon-containing precursors that have one or more silicon-hydrogen bonds and/or silicon-silicon bonds. The silicon-containing precursors also have one or more silicon-oxygen bonds and/or silicon-carbon bonds. A precursor can be made reactive by breaking the silicon-hydrogen bond(s), e.g., stripping a hydrogen from the precursor, or breaking the silicon-silicon bond(s) if present in the precursor, while preserving one or more of the silicon-oxide bonds and/or silicon-carbon bonds in the precursor. The resulting film may contain the one or more silicon-oxygen and/or silicon-carbon bonds. The precursor may be converted to a reactive but substantially intact form by converting it to a radical or other reactive species in which a hydrogen atom or other atom is extracted. The hydrogen or other atom may be extracted by, for example, exposing the precursor to a radical species. In certain embodiments, one or more radical species in a substantially low energy state can react with the silicon-containing precursor(s) to form the oxygen doped silicon carbide. The one or more radical species can be formed in a remote plasma source. The oxygen doped silicon carbide can be used in a wide variety of applications, including but not limited to serving as liners, spacers, etch stops, copper diffusion barriers, pore sealants, and ultra low-k dielectric layers.

One aspect of the invention relates to a method of depositing oxygen doped silicon carbide. The method includes providing a substrate; introducing a silicon-containing precursor onto the substrate, where the silicon-containing precursor has (i) one or more silicon-hydrogen bonds and/or silicon-silicon bonds and (ii) one or more silicon-oxygen bonds and/or one or more silicon-carbon bonds; and introducing from a source gas one or more radical species in a substantially low energy state to react with the silicon-containing precursor to form oxygen doped silicon carbide on the substrate under conditions that break silicon-hydrogen bonds or silicon-silicon bonds but substantially preserve the silicon-oxygen bonds and/or the silicon-carbon bonds.

In some aspects, the silicon-containing precursor can include at least one of a cyclic siloxane, alkoxy silane, or alkyl silane. The radical species can be produced from a gas selected from the group consisting of hydrogen, nitrogen, an amine, and ammonia. Introducing the one or more radical species can include exposing the source gas to a remote plasma. The substrate can include exposed copper, such that the method can further include forming the oxygen doped silicon carbide directly over the exposed copper. The substrate can include a transistor having a gate electrode, such that the method can further include forming the oxygen doped silicon carbide on one or more sidewalls of the gate electrode. The substrate can include a dielectric having a plurality of pores, such that the method can further include sealing the plurality of pores with the oxygen doped silicon carbide. In some aspects, the oxygen doped silicon carbide can be an ultralow-k dielectric thin film.

Another aspect of the invention relates to an apparatus for depositing an oxygen doped silicon carbide film on a substrate. The apparatus includes a reaction chamber comprising the substrate; a plasma chamber coupled to the reaction chamber and configured to generate a plasma outside the reaction chamber; two or more gas inlets coupled to the reaction chamber; and a controller comprising instructions for performing the following operations: (a) flowing a silicon-containing precursor through one of the gas inlets into the reaction chamber, where the silicon-containing precursor has one or more silicon-hydrogen bonds and/or silicon-silicon bonds and one or more silicon-oxygen bonds and/or one or more silicon-carbon bonds; (b) providing one or more radical species in a substantially low energy state from the plasma in the plasma chamber; (c) flowing the one or more radical species through another one of the gas inlets into the reaction chamber to react with the silicon-containing precursor to form the oxygen doped silicon carbide film on the substrate.

These and other embodiments are described further below with reference to the figures.

DETAILED DESCRIPTION

Figure 1A:
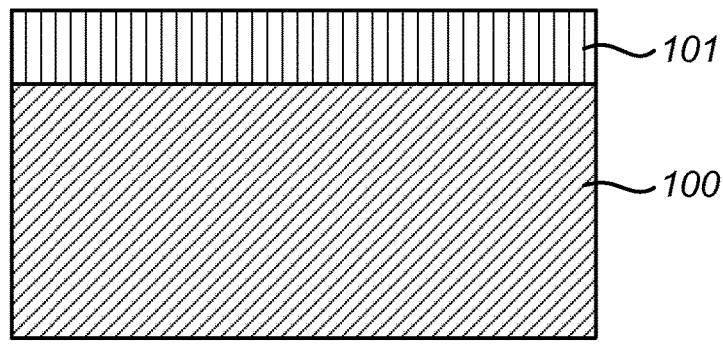
FIG. 1A illustrates a cross-section of an example of an SiOC film deposited over a substrate.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Manufacture of semiconductor devices typically involves depositing one or more thin films on a substrate in an integrated fabrication process. In some aspects of the integrated process, classes of thin films such as SiC and SiCN can be deposited using atomic layer deposition (ALD), chemical vapor deposition (CVD), plasma-enhanced chemical vapor deposition (PECVD), or any other suitable deposition method.

Another class of thin films that can be deposited includes oxygen doped silicon carbide (SiOC). In some embodiments, SiOC thin films can be deposited using PECVD. Precursor molecules for deposition of SiOC can include silicon-containing precursor molecules having silicon-hydrogen (Si—H) bonds and/or silicon-silicon (Si—Si) bonds, and silicon-oxygen (Si—O) bonds and/or silicon-carbon (Si—C) bonds. Current PECVD processes may use in situ plasma processing directly adjacent to a processed substrate.

However, it has been found that depositing high-quality SiOC thin films can have several challenges. For example, such challenges can include providing SiOC thin films with excellent step coverage, low dielectric constants, high breakdown voltages, low leakage currents, high porosity, and coverage over exposed copper surfaces without oxidizing the copper surfaces, as discussed further below.

While this disclosure is not limited by any particular theory, it is believed that the plasma conditions in typical PECVD processes break apart the silicon-containing precursor molecules to produce undesirable effects. For example, PECVD process may provide direct plasma conditions that break the Si—O and/or Si—C bonds in the precursor molecules. This can lead to producing highly reactive radicals with increased sticking coefficients. Particularly, the deposited SiOC film can have a structure in which the silicon, carbon, and/or oxygen bonds are "dangling," meaning that silicon, carbon, and/or oxygen will have reactive unpaired valence electrons. The increased sticking coefficients of the precursor molecules can lead to deposition of SiOC films with poor step coverage, as reactive precursor fragments may tend to stick to sidewalls of previously deposited films or layers.

Further, the direct plasma conditions sometimes employed in PECVD can lead to directionality in the deposition because the energy to break up the precursor molecules can be a low frequency which creates a lot of ion bombardment at the surface. The directional deposition can also lead to deposition of SiOC films with poor step coverage.

The dangling bonds can also result in the production of silanol groups (Si—OH) in the deposited SiOC film. This can produce SiOC films with increased dielectric constants because the direct plasma conditions tend to extract carbon out.

Furthermore, the dangling bonds can result in the production of increased silicon-hydrogen bonding (Si—H) in the deposited SiOC film. In particular, broken bonds of Si—C can be replaced with Si—H in direct plasma conditions. The presence of Si—H bonds in SiOC films can produce films with poor electrical properties. For example, the presence of Si—H bonds can reduce breakdown voltages and can increase leakage currents because the Si—H bonds provide a leakage path for electrons.

Plus, the dangling bonds can lead to uncontrolled chemical structures in the SiOC films. In one aspect, the uncontrolled chemical structures can lead to dense filaments with little to no porosity, which can result in an increased dielectric constant. The lack of porosity can be the result of the direct plasma conditions breaking down Si—C and/or Si—O bonds in cyclic siloxanes that can otherwise provide porosity in an ultralow-k dielectric material.

Moreover, typical PECVD processes avoid depositing SiOC films over exposed copper surfaces because such processes can oxidize copper. The PECVD process may use oxidants such as oxygen ($O_2$), ozone ($O_3$), carbon dioxide ($CO_2$), or other oxidizing species in order to form SiOC.

Environment at the Substrate Surface During Deposition

Figure 1B:
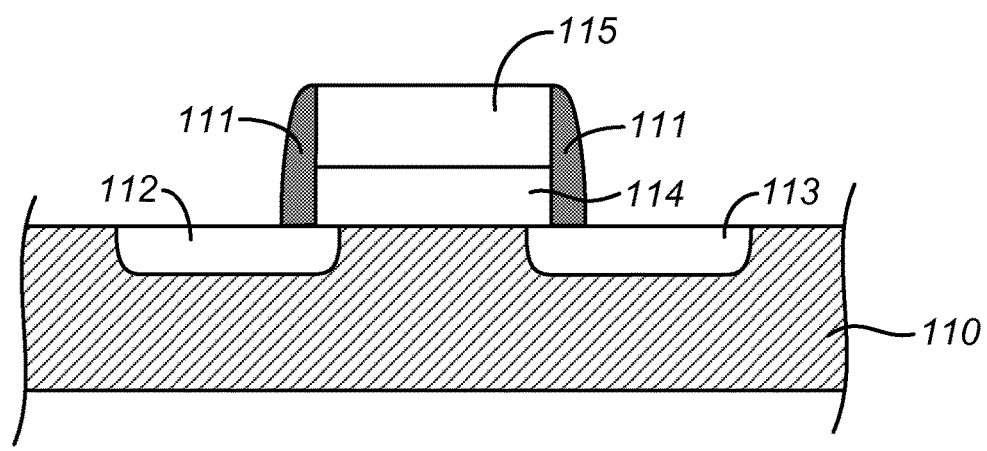
FIG. 1B illustrates SiOC vertical structures on the sidewalls of a gate electrode structure of a transistor.
Figure 1C:
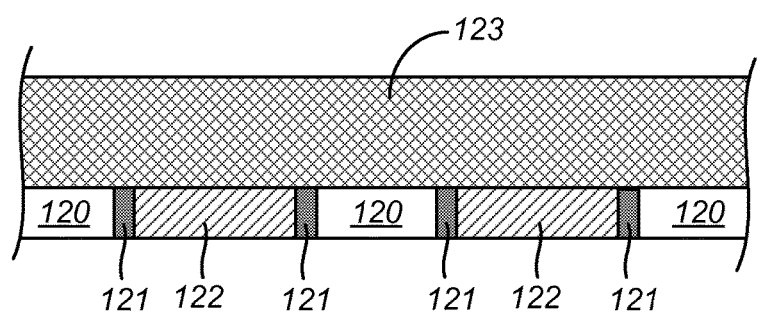
FIG. 1C illustrates SiOC vertical structures on exposed sidewalls of copper lines in an air gap type metallization layer.
Figure 1D:
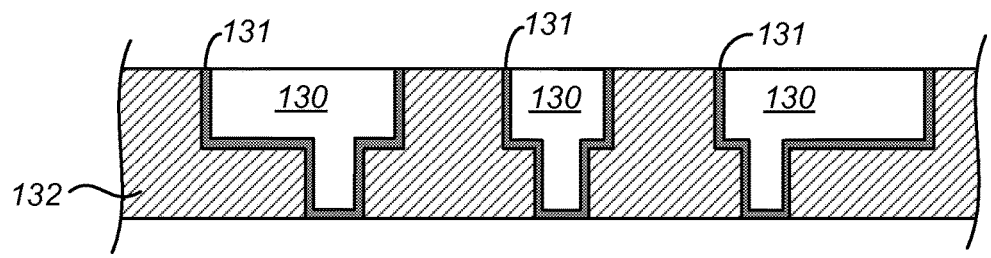
FIG. 1D illustrates SiOC pore sealants for porous dielectric materials

FIG. 1A illustrates a cross-section of an example of an SiOC film deposited over a substrate. The SiOC film 101 can be formed under the appropriate process conditions and environments adjacent to the substrate 100. The substrate 100 can include any wafer, semiconductor wafer, partially fabricated integrated circuit, printed circuit board, or other appropriate work piece. The process conditions for depositing the SiOC film 101 can include one or more silicon-containing precursors having one or more Si—H bonds and/or one or more Si—Si bonds. Certain applications of SiOC films are depicted in FIGS. 1B-1D. In some embodiments, the silicon-containing precursors can include silicon-oxide precursors and/or silicon-carbide precursors. The silicon-oxide precursors can include one or more Si—O bonds and the silicon-carbide precursors can include one or more Si—C bonds. In some embodiments, for example, the silicon-containing precursors can include a reactant A with Si—O and Si—C bonds. In some embodiments, the silicon-containing precursors can include a reactant B with Si—O bonds and a reactant C with Si—C bonds. It will be understood that any number of suitable reactants may be employed in the scope of this present disclosure. The chemical structures of exemplary silicon-containing precursors are discussed in further detail below.

The silicon-containing precursors include one or more Si—H bonds and/or one or more Si—Si bonds. During the deposition process, the Si—H bonds and/or Si—Si bonds will be broken and serve as reactive sites for forming bonds between the silicon-containing precursors in the deposited SiOC film 101. The broken bonds can also serve as sites for cross-linking during thermal processing conducted during or after deposition. Bonding at the reactive sites and cross-linking can form a primary backbone or matrix collectively in the resulting SiOC film 101.

In some embodiments, the process conditions can substantially preserve Si—O and Si—C bonds in the as-deposited layer of the SiOC film 101. Accordingly, the reaction conditions adjacent to the substrate 100 provide for the breaking of Si—H and/or Si—Si bonds, e.g., extracting hydrogen from the broken Si—H bonds, but the reaction conditions do not provide for extracting oxygen from Si—O bonds or carbon from Si—C bonds. Generally, the described reaction conditions exist at the exposed face of the work piece (the face where the SiOC film is deposited). They may further exist at some distance above the work piece, e.g., about 0.5 micrometers to about 150 millimeters above the work piece. In effect, activation of the precursor can happen in the gas phase at a substantial distance above the work piece. Typically, the pertinent reaction conditions will be uniform or substantially uniform over the entire exposed face of the work piece, although certain applications may permit some variation.

In addition to silicon-containing precursors, the environment adjacent the work piece can include one or more radical species, preferably in a substantially low energy state. An example of such species includes hydrogen atom radicals. In some embodiments, all or substantially all the hydrogen atom radicals can be in the ground state, e.g., at least about 90% or 95% of the hydrogen atom radicals adjacent the work piece are in the ground state. Other examples of radical species include nitrogen-containing species, such as elemental nitrogen radicals and amine radicals such as ammonia radicals, where nitrogen can be incorporated into the film. Examples of amine radicals include but are not limited to radicals of methylamine, dimethylamine, and aniline. The aforementioned radical species may be produced from a gas that includes hydrogen, nitrogen, amine, ammonia, or mixtures thereof. In some embodiments, as discussed in further detail below, the radical species can be produced by a remote plasma source.

In some embodiments, the process conditions will have radical species in a substantially low energy state to break Si—H bonds and/or Si—Si bonds while substantially preserving Si—O and Si—C bonds. The process conditions will not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O or Si—C bonds, which can produce films with undesirable electrical properties (e.g., high dielectric constants and/or low breakdown voltages) and poor conformality. It is believed that an excessively reactive environment produces reactive precursor fragments that have high sticking coefficients (representing a propensity to chemically or physically stick to work piece sidewalls), resulting in poor conformality.

The silicon-containing precursors can be present in relative proportions with other species in the environment adjacent to the substrate 100. In particular, the silicon-containing precursors may be present with the radical species and other species, including other reactive species and/or carrier gases. In some embodiments, the silicon-containing precursors may be introduced in a mixture. Upstream from the deposition reaction surface, the silicon-containing precursors can be mixed with an inert carrier gas. Example inert carrier gases include, but are not limited to, nitrogen ($N_2$), argon (Ar), and helium (He). In addition, the silicon-containing precursors can be introduced in a mixture having major and minor species, with the minor species containing some element or structural feature (e.g., a ring structure, a cage structure, an unsaturated bond, etc.) that is present in the SiOC film 101 at a relatively low concentration. The precursors may be present in equimolar or relatively similar proportions as appropriate to form the primary backbone or matrix in the resulting SiOC film 101. In other embodiments, the relative amounts of the different precursors are substantially skewed from equimolarity.

The temperature in the environment adjacent to the substrate 100 can be any suitable temperature depending on the application of the device containing the SiOC film 101. The temperature in the environment adjacent to the substrate 100 can be largely controlled by the temperature of a pedestal on which a substrate 100 is supported during deposition of the SiOC film 101. In some embodiments, the operating temperature can be between about 50° C. and about 500° C. For example, the operating temperature can be between about 250° C. and about 400° C., such as in many integrated circuit applications. In some embodiments, increasing the temperature can lead to increased cross-linking on the substrate surface.

The pressure in the environment adjacent to the substrate 100 can be any suitable pressure to produce reactive radicals in a process chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radiofrequency (RF) generated plasma.

FIGS. 1B-1D illustrate cross-sections of SiOC films in a variety of applications. FIG. 1B illustrates SiOC vertical structures on the sidewalls of a gate electrode structure of a transistor. FIG. 1C illustrates SiOC vertical structures on exposed sidewalls of copper lines in an air gap type metallization layer. FIG. 1D illustrates SiOC pore sealants for porous dielectric materials. Each of these applications are discussed in further detail below.

Chemical Structure of Precursors

As discussed earlier herein, the precursors employed in forming SiOC films can include silicon-containing precursors, with at least some of the silicon-containing precursors having at least one Si—H or Si—Si bond. In addition, the silicon-containing precursors can include at least one Si—O bond and/or Si—C bond. While any number of appropriate precursors can be used in forming SiOC films, at least some of the precursors will include silicon-containing precursors with at least one Si—H bond or Si—Si bond, and at least one Si—O bond and/or Si—C bond.

In some embodiments, the silicon-containing precursors may fall into one of three or more chemical classes, any of which may be present alone as the sole precursor or in combination with other types of precursors. It will be understood that other appropriate chemical classes of silicon-containing precursors may be employed and that the silicon-containing precursors are not limited to the chemical classes discussed below.

First, the silicon-containing precursor can be a siloxane. In some embodiments, the siloxane may be cylic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into an SiOC film, with the size of the pores corresponding to the radius of the ring. For example, a cyclotetrasiloxane ring can have a radius of about 6.7 Å.

Figure 2:
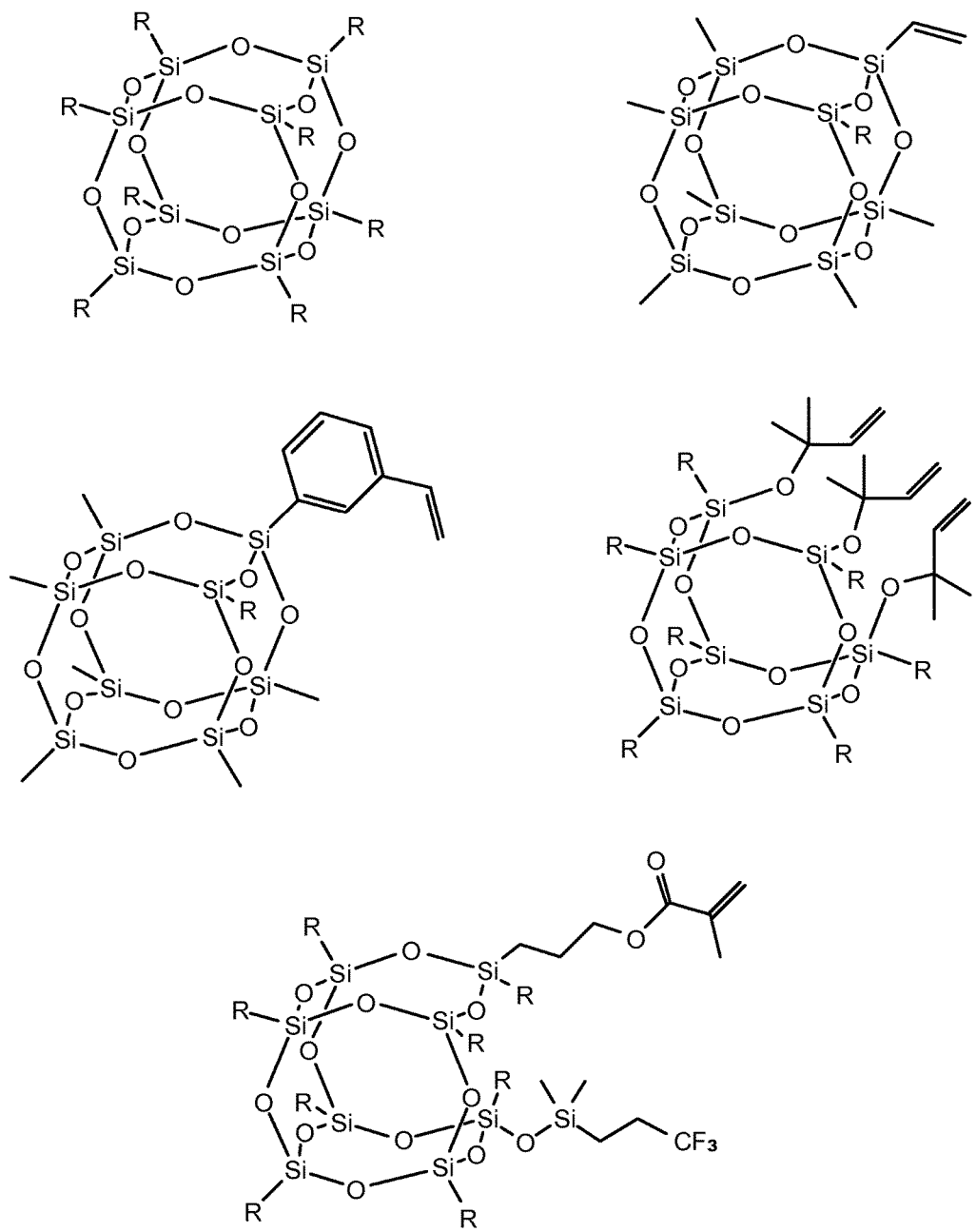
FIG. 2 illustrates examples of representative caged siloxane precursors.

In some embodiments, the siloxane may have a three-dimensional or caged structure. FIG. 2 illustrates examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein for all purposes. Like the cyclic siloxanes, the caged siloxane can introduce porosity into an SiOC film. In some embodiments, the porosity scale is mesoporous.

In some embodiments, the siloxane may be linear. Linear siloxanes may include but are not limited to disiloxanes, such as pentamethyldisiloxane (PMDSO) and tetramethyldisiloxane (TMDSO).

Second, the silicon-containing precursor can be an alkyl silane. The alkyl silanes include a central silicon atom with one or more alkyl groups bonded to it as well as one or more hydrogen atoms bonded to it. In certain embodiments, any one or more of the alkyl groups contain 1-5 carbon atoms. The alkyl groups may be saturated or unsaturated. Examples include but are not limited to trimethylsilane (3MS) and dimethylsilane (2MS).

Third, the silicon-containing precursor can be an alkoxy silane. The alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. In some embodiments, one of the silicon atoms can have a carbon-containing or alkoxy-containing group exclusively attached to it, and one of the silicon atoms can have a hydrogen atom exclusively attached to it.

In depositing SiOC, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting SiOC film. For example, the amount of siloxane can be greater than the amount of silane in molar percentages to produce a porous film as discussed in more detail below.

Structure and Properties of the Deposited Film

The deposited film will include relative proportions of silicon, oxygen, and carbon. In some embodiments, the atomic concentration of silicon is between about 15% and 45%, the atomic concentration of oxygen is between about 10% and 40%, and the atomic concentration of carbon is between about 30% and 60%. In more specific embodiments, the atomic concentration of silicon is about 30%, the atomic concentration of oxygen is about 25%, and the atomic concentration of carbon is about 45%. It will be understood that the relative atomic concentrations can vary depending on the choice of the precursor. In some embodiments, the deposited film can also contain nitrogen. The silicon atoms will form bonds with carbon and/or oxygen atoms. The deposited film may contain a ratio of Si—O bonds to Si—C bonds that is between about 0.5:1 and 3:1. In more specific embodiments, the deposited film contains more Si—O bonds than Si—C bonds. This can provide a more porous film with a lower dielectric constant. In some embodiments, the internal structure of the precursor is maintained in the deposited film. This structure may preserve all or most of the Si—C and Si—O bonds in the precursor, while linking or cross-linking individual precursor moieties through bonds at locations where Si—H bonds existed in the precursor molecules or through additional condensation reactions on the growing surface if sufficient thermal energy is provided.

The process conditions described earlier herein can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. In certain embodiments, for an aspect ratio of about 6:1 the SiOC film can be deposited with a conformality of between about 25% and 100%, and typically between about 50% and 80%.

The process conditions can also provide a film structure with a high breakdown voltage and a low leakage current. By introducing a limited amount of oxygen into a SiC class of material, leakage paths provided by Si—H bonds and/or Si—CH$_2$—Si bonds may be blocked by oxygen. This can lead to improved electrical properties while maintaining a relatively low dielectric constant. In various embodiments, the film has an effective dielectric constant of about 4.0 or lower, and in some cases about 3.5 or lower, and some cases about 3.0 or lower, and in still other implementations about 2.5 or lower. The effective dielectric constant can depend on the bonding and density. In some embodiments, the SiOC film can have an effective dielectric constant greater than about 4.0 to provide a relatively dense, highly cross-linked SiOC film. In some embodiments, the SiOC film can have a reduced thickness and serve as a hermetic or diffusion barrier.

In some embodiments, the deposited film can be porous. As discussed earlier herein, the silicon-containing precursors can include cyclic siloxanes and caged siloxanes. Thus, the cyclic siloxanes and caged siloxanes can introduce porosity into the structure of the deposited film. Porosity in the deposited film can further lower the dielectric constant. In some embodiments, the porosity of the deposited SiOC film is between about 20% and 50%. The pore size of porous film may track that of the cyclic or caged precursor. In certain embodiments, the film's average pore size is between about 5 Å and 20 Å, such as about 16 Å.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source may minimize the harsh reaction conditions otherwise caused by a direct plasma.

Figure 3:
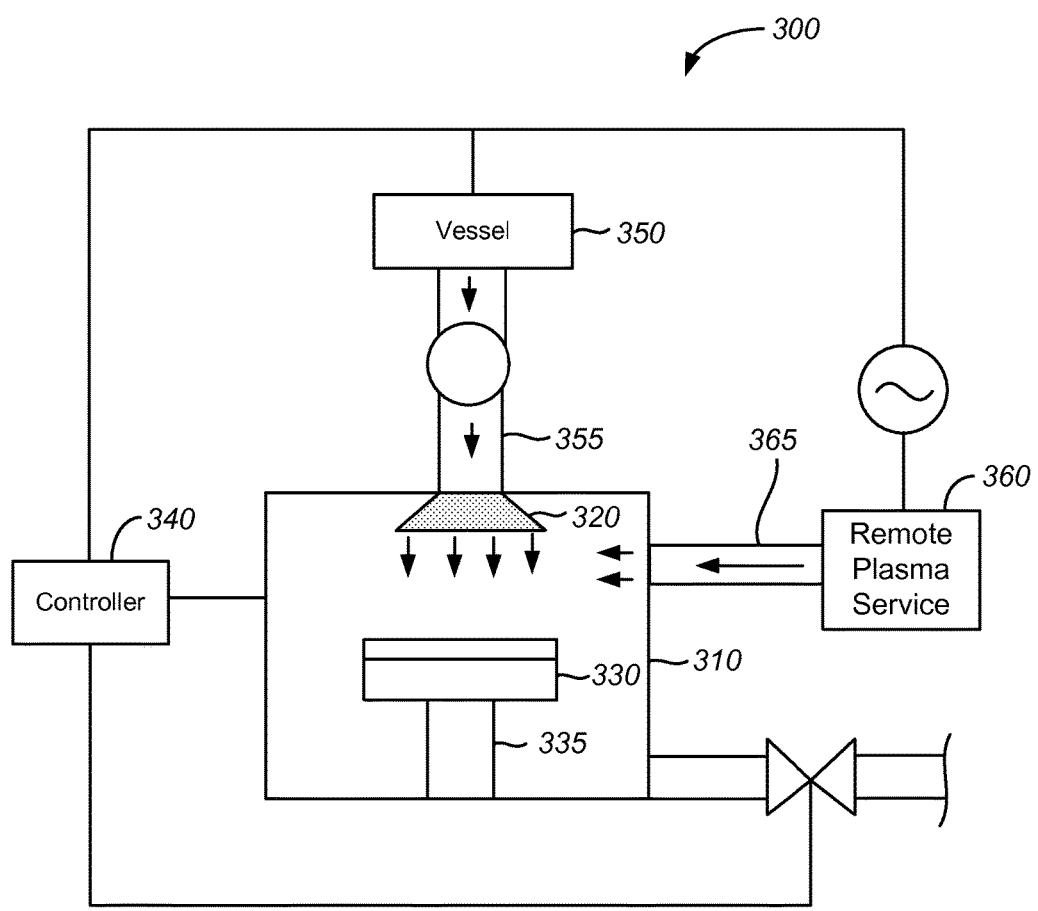
FIG. 3 illustrates a schematic view of a processing apparatus with a remote plasma source.

FIG. 3 illustrates a schematic diagram of a remote plasma apparatus according to certain embodiments. The device 300 includes a reaction chamber 310 with a showerhead assembly 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions or controlling process conditions for the operations of the device 300, such as the temperature process conditions and/or the pressure process conditions.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330.

One or more radical species may be generated in the remote plasma source 360 and configured to enter the reaction chamber 310 via the gas inlet 365. Any type of plasma source may be used in remote plasma source 360 to create the radical species. This includes, but is not limited to, capacitively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Novellus Systems of San Jose, Calif. Another example of such a RF remote plasma source 360 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., adjusting the RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 10 cm and 50 cm, such as about 30 cm.

The controller 340 may contain instructions for controlling process conditions for the operation of the device 300. The controller 340 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 340 or they may be provided over a network.

In certain embodiments, the controller 340 controls all or most activities of the semiconductor processing device 300 described herein. For example, the controller 340 may control all or most activities of the semiconductor processing device 300 associated with depositing protective layers and removing sacrificial materials. The controller 340 may execute system control software include sets of instructions for controlling the timing, gas composition, gas density, flow rates, chamber pressure, chamber temperature, RF power levels, substrate position, and/or other parameters. Other computer programs, scripts, or routines stored on memory devices associated with the controller 340 may be employed in some embodiments. To provide relatively mild reactive conditions at the environment adjacent to the substrate 330, parameters such as the RF power levels, gas density, and timing of the plasma can be adjusted by controller 340. Additionally, adjusting the substrate position may further reduce the presence of high-energy radical species at the environment adjacent to the substrate 330.

The process conditions and the process flow itself can be controlled by the controller 340 which comprises program instructions for a monitoring, maintaining and/or adjusting certain process variables. For example, instructions specifying flow rates may be included. Instructions may also include parameters of pre-clean, passivation, protective layer formation, non-protective layer, pinning operations, other post-deposition treatments, etching, partial filling, and the like. The controller 340 may comprise different or identical instructions for different apparatus stations, thus allowing the apparatus stations to operate either independently or synchronously.

In some embodiments, the controller 340 may include instructions for performing operations such as flowing a silicon-containing precursor through the first gas inlet 355 into the reaction chamber 310, providing the one or more radical species in a substantially low energy state in the remote plasma source 360, and flowing the one or more radical species through the second gas inlet 365 into the reaction chamber 310 to react with the silicon-containing precursor to form the oxygen doped silicon carbide film on the substrate 330.

In some embodiments, there may be a user interface associated with controller 340. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

Applications

The present disclosure may be further understood by reference to the following applications for high-quality SiOC films, which applications are intended to be purely exemplary. The present disclosure is not limited in scope by the specified applications, which are simply illustrations of aspects of the disclosure. Various modifications of the present disclosure in addition to those described herein will become apparent to those of ordinary skill in the art from the foregoing description. Moreover, such modifications fall within the scope of the appended claims.

In some embodiments, an SiOC film may be deposited over exposed copper. In depositing the SiOC film, reaction conditions adjacent to the substrate can be free of oxidants, such as $O_2$, $O_3$, and $CO_2$, including radicals thereof. Thus, the SiOC film may be deposited directly over the exposed copper without oxidizing copper (e.g., creating cupric oxide). Such films can serve as etch stop layers, which can also serve as copper diffusion barriers. The presence of the SiOC film can provide a sufficiently low dielectric constant with excellent leakage properties to serve as a diffusion barrier. The SiOC film can be an etch stop and/or diffusion barrier either by itself or as a bilayer stack (e.g., SiOC/SiNC bilayer deposited over exposed copper). In some embodiments, the SiOC film can be placed in between adjacent metallization layers that are typically produced by a damascene process. The SiOC film can resist etching and can be sufficiently dense to minimize the diffusion of copper ions into adjacent regions of dielectric material. In some embodiments, the precursor employed for the SiOC film can be non-cyclic. Non-cyclic precursors can include PMDSO or TMDSO. The non-cyclic precursor can provide a sufficiently high density to serve as a hermetic or diffusion barrier. In some embodiments, nitrogen may be incorporated into the film by employing nitrogen-containing precursors or plasma activating nitrogen-containing radicals, such as elemental nitrogen radicals or amine radicals.

In some embodiments, a SiOC film may be deposited as vertical structures adjacent to metal or semiconductor structures. Deposition of SiOC provides excellent step coverage along sidewalls of the metal or semiconductor structures to create the vertical structures. In certain embodiments, the vertical structures may be referred to as spacers or liners. FIG. 1B illustrates a cross-section of SiOC liners deposited on the sidewalls of a gate electrode structure of a transistor. As illustrated in FIG. 1B, the transistor can be a CMOS transistor with a silicon substrate 110 having a source 112 and a drain 113. A gate dielectric 114 can be deposited over the silicon substrate 110, and a gate electrode can be deposited over the gate dielectric 114 to form the transistor. SiOC liners 111 can be deposited on the sidewalls of the gate electrode 115 and gate dielectric 114. In another example, FIG. 1C illustrates a cross-section of SiOC deposited on sidewalls of exposed copper lines in an air gap type metallization layer. Air gaps 120 can be introduced into an integrated circuit layer between copper lines 122 that can reduce the effective k-value of the layer. SiOC liners 121 can be deposited on the sidewalls of the copper lines 122, and a nonconformal dielectric layer 123 can be deposited the air gaps 120, liners 121, and copper lines 122. Examples of such air gap type metallization layers can be described in U.S. Patent Publication No. 2004/0232552 to Fei Wang et al., which is herein incorporated by reference.

In some embodiments, a SiOC film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. FIG. 1D illustrates a cross-section of SiOC as a pore sealant for porous dielectric materials. A porous dielectric layer 132 can have a plurality of trenches or vias cut into the porous dielectric layer 132 to form pores 130. SiOC 131 can be deposited along the pores 130 to effectively seal the pores 130. Sealing the pores 130 with the SiOC 131 can avoid damaging the porous dielectric layer 132 that may otherwise be incurred by other sealing techniques using a plasma. The SiOC 131 can be sufficiently dense as a pore sealant and may include non-cyclic silicon-containing precursors, such as PMDSO and TMDSO. In some embodiments, an etched dielectric material such as the porous dielectric layer 132 may first be treated by a "k-recovery" process, which exposes the porous dielectric layer 132 to UV radiation and a reducing agent. This recovery process is further described in commonly owned U.S. Patent Publication No. 2011/0111533 to Varadarajan et al., which is incorporated by reference herein for all purposes. In another "k-recovery" process, the porous dielectric layer 132 can be exposed to UV radiation and a chemical silylating agent. This recovery process is further described in commonly owned U.S. Patent Publication No. 2011/0117678 to Varadarajan et al., which is incorporated by reference herein for all purposes. After exposing the pores 130 to the recovery treatment, which makes the surface more hydrophilic and provides a monolayer of material, a layer of conformally deposited SiOC 131 can be deposited to effectively seal the pores of the porous dielectric layer 132.

In some embodiments, a SiOC film may be deposited as an ultra low-k dielectric material itself. Ultra low-k dielectrics are conventionally defined as those materials that have a dielectric constant lower than that of 2.5. In such configurations, the ultra low-k dielectric material of SiOC can be a porous dielectric layer. The pores of the dielectric layer can be introduced by using cyclic or caged precursor molecules, including the cyclic siloxanes and silsesquioxanes. In one example, the porosity of the ultra low-k dielectric layer of SiOC can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of depositing oxygen doped silicon carbide, the method comprising:
    providing a substrate;
    flowing one or more silicon-containing precursors onto the substrate, wherein each of the one or more silicon-containing precursors have (i) one or more silicon-hydrogen bonds and/or silicon-silicon bonds and (ii) one or more silicon-oxygen bonds and one or more silicon-carbon bonds;
    flowing a source gas into a plasma source;
    generating, from the source gas, radicals of hydrogen in the plasma source; and
    introducing the radicals of hydrogen onto the substrate, wherein at least 90% of the radicals are radicals of hydrogen in the ground state that react with the one or more silicon-containing precursors to form oxygen doped silicon carbide on the substrate under conditions that selectively break one or both of silicon-hydrogen bonds and silicon-silicon bonds but preserve the silicon-oxygen bonds and the silicon-carbon bonds, wherein a ratio of oxygen to carbon concentration in the oxygen doped silicon carbide is between 0.5:1 and 3:1.

2. The method of claim 1, wherein the silicon-containing precursors include cyclic siloxanes.

3. The method of claim 2, wherein the cyclic siloxanes are selected from the group consisting of TMCTS, OMCTS, and HMCTS.

4. The method of claim 2, wherein the cyclic siloxanes are caged siloxanes.

5. The method of claim 1, wherein the silicon-containing precursors include alkoxy silanes.

6. The method of claim 1, wherein the silicon-containing precursors include alkyl silanes.

7. The method of claim 1, wherein the radicals are produced from a source gas of hydrogen.

8. The method of claim 1, wherein generating the radicals of hydrogen comprises exposing the source gas to a remote plasma.

9. The method of claim 1, wherein the oxygen doped silicon carbide comprises a conformal thin film on the substrate.

10. The method of claim 1, wherein the substrate comprises exposed copper, the method further comprising forming the oxygen doped silicon carbide directly over the exposed copper.

11. The method of claim 1, wherein the substrate comprises a transistor having a gate electrode, the method further comprising forming the oxygen doped silicon carbide on one or more sidewalls of the gate electrode.

12. The method of claim 1, wherein the substrate comprises a dielectric having a plurality of pores, the method further comprising sealing the plurality of pores with the oxygen doped silicon carbide.

13. The method of claim 1, wherein the oxygen doped silicon carbide comprises an ultralow-k dielectric thin film.

14. The method of claim 13, wherein the ultralow-k dielectric thin film is porous.

\* \* \* \* \*